United States Patent
Chen et al.

[19]

[11] Patent Number: 5,859,558
[45] Date of Patent: Jan. 12, 1999

[54] LOW VOLTAGE ANALOG FRONT END

[75] Inventors: Ricky Y. Chen, Irvine; Lloyd F. Linder, Agoura Hills; Don C. Devendorf, Carlsbad, all of Calif.

[73] Assignee: Raytheon Company, El Segundo, Calif.

[21] Appl. No.: 827,855

[22] Filed: Apr. 11, 1997

[51] Int. Cl.$^6$ ........................................ G06G 7/12
[52] U.S. Cl. .................. 327/355; 327/356; 327/359
[58] Field of Search ........................ 327/355, 356, 327/359, 361, 530, 534, 535, 538, 543, 561, 563

[56] References Cited

U.S. PATENT DOCUMENTS

| | | | |
|---|---|---|---|
| 3,956,661 | 5/1976 | Sakamoto et al. ....................... | 327/538 |
| 4,030,023 | 6/1977 | Keith ............................................. | 323/4 |
| 4,344,188 | 8/1982 | Tanabe et al. ............................ | 455/326 |
| 4,461,042 | 7/1984 | Tanabe et al. ............................. | 455/33 |
| 4,480,337 | 10/1984 | Graziadei et al. ....................... | 455/333 |
| 4,833,342 | 5/1989 | Kiryu et al. ............................ | 307/296.1 |
| 5,187,395 | 2/1993 | Pirez ......................................... | 307/491 |
| 5,379,457 | 1/1995 | Nguyen ..................................... | 327/113 |
| 5,448,772 | 9/1995 | Grandfield .............................. | 455/333 |
| 5,521,545 | 5/1996 | Terry et al. ............................... | 327/355 |

OTHER PUBLICATIONS

Gray and Meyer, *Analysis and Design of Analog Integrated Circuits*, John Wiley and Sons, Inc. (1984), pp. 194–197, 590–605.

*Primary Examiner*—Timothy P. Callahan
*Assistant Examiner*—Jeffrey Zweizig
*Attorney, Agent, or Firm*—Leonard A. Alkov; William C. Schubert; Glenn H. Lenzen, Jr.

[57] ABSTRACT

A low voltage analog front end (AFE) includes a differential transistor pair which converts an input voltage, typically A.C.-coupled to the pair's control inputs, to a differential current. Impedance networks connected to each transistor's control input are joined together at a common node, and a current source is connected to the node which causes DC bias currents to be mirrored through the pair's current circuits, so that the AFE's differential output current comprises a differential current produced by the pair in response to an input voltage and superimposed on the DC bias currents. The current source preferably generates mirrored currents which are larger than its reference current to linearize the pair's response and to provide the AFE with a wide dynamic range. An input to the AFE sees a low impedance which is about equal to the sum of the impedance networks, which can be resistive or complex as needed. The AFE has widespread application as a front end circuit, serving as a low voltage input stage for a Gilbert mixer, for example. By generating bias currents via the pair's control inputs, supply voltage headroom requirements are reduced, improving a system's dynamic range and/or enabling the use of lower voltage power supplies. The AFE can be configured as either a differential or single-ended voltage-to-differential current converter.

19 Claims, 4 Drawing Sheets

LOW VOLTAGE ANALOG FRONT END

BACKGROUND OF THE INVENTION

1. Field of the Invention

This invention relates to the field of analog front end circuits, particularly those used to convert an input voltage to a differential current.

2. Description of the Related Art

Circuits that convert an input voltage to a differential current are widely used, especially within RF circuit blocks; these V-to-I conversion circuits are referred to as "analog front end" (AFE) circuits. They are typically implemented using a differential pair of npn transistors which are emitter-coupled, and are biased with a current source connected to the coupled emitter junction; the input stage of a Gilbert mixer is an example.

Figure 1:
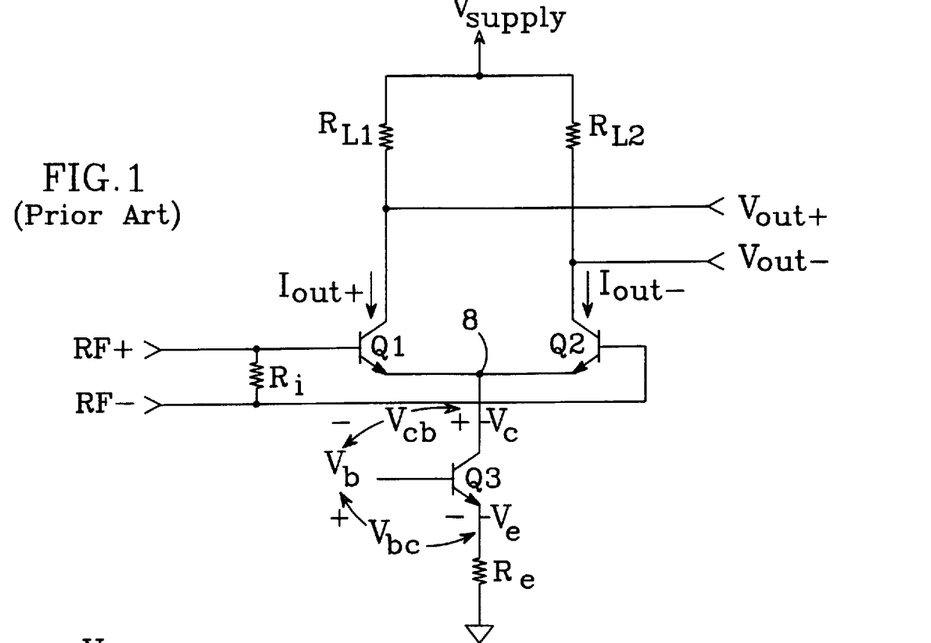
FIG. 1 is a schematic diagram of a known AFE circuit.

A known AFE circuit is shown in FIG. 1. The emitters of a differential pair of npn transistors Q1 and Q2 are coupled together at a node 8, and the pair is biased with a current source consisting of an npn transistor Q3, with Q3's collector connected to the node 8, its emitter connected to ground through an emitter resistor $R_e$, and its base connected a bias voltage $V_b$. A differential input voltage composed of signals RF+ and RF− is connected across the respective bases of Q1 and Q2, and differential current signals $I_{out+}$ and $I_{out-}$ are produced at their respective collectors. An input resistor $R_i$ is often connected across the differential input voltage lines to provide a particular input impedance to the incoming signal; for example, 50 Ω is typically presented to an RF input. The differential output current is sometimes converted back to a differential voltage by connecting the collectors of Q1 and Q2 to a supply voltage $V_{supply}$ via load resistors $R_{L1}$ and $R_{L2}$, to produce differential output voltage signals $V_{out+}$ and $V_{out-}$. AFE's of this type are discussed, for example, in Gray and Meyer, *Analysis and Design of Analog Integrated Circuits*, John Wiley and Sons, Inc. (1984), pp. 194–197.

A problem with the circuit of FIG. 1 is that some of its supply voltage headroom is lost to the current source connected to the coupled-emitter junction. "Headroom" is defined as the portion of a circuit's supply voltage which is available for use by the circuit's signals. Depending on the circuit's design requirements and temperature, the voltage at Q3's emitter $V_e$ is typically between about 200 and 500 mv. Q3's base-emitter voltage $V_{be}$ is typically between about 700 to 900 mv (for a npn transistor), and its collector-base voltage $V_{cb}$ is about 0 to 300 mv. Adding these voltages together produces a voltage at node 8 of between about 0.9 and 1.7 volts. Additional voltage is necessarily dropped across Q1 and Q2. If the voltage at node 8 is one volt, and another one volt is dropped across Q1 and Q2, $V_{out+}$ and $V_{out-}$ can only assume voltages between $V_{supply}$ and 2 volts. This loss of valuable supply voltage headroom can be a significant portion of the total supply voltage, which is often as low as 3 volts. Lost headroom reduces the dynamic range of the AFE and can necessitate the use of a higher voltage power supply, which increases the power dissipation needs of the circuitry using the AFE and subsequently increases the weight of the system employing the circuit.

SUMMARY OF THE INVENTION

An AFE is presented that converts an input voltage to a differential output current, while eliminating the loss of headroom that occurs with the known differential pair circuit discussed above.

The present invention uses an innovative biasing scheme in which a differential pair's respective bias currents are generated via current mirroring, rather than with the prior art method of connecting a current source to the pair's coupled-emitter junction. Two transistors, preferably npn transistors, are used as a differential pair (though not coupled together), converting an input voltage applied across their respective bases to a differential current produced at their respective collectors. Two impedance networks are connected to the transistors' respective bases, with the networks' opposite ends joined together at a common node. A current source connected to the common node forces voltages across the respective base-emitter circuits of the pair transistors so that the source's reference current is mirrored through the pair transistors; the mirrored currents serve as DC bias currents for the pair. The pair produces a total differential output current comprised of the differential current produced in response to the input voltage, superimposed on the DC bias currents.

To keep power dissipation low, the current source preferably includes a current reference circuit and an output buffer stage, so that DC bias currents that are substantially larger than the reference current are mirrored through the pair's current circuits. These large DC bias currents linearize the response of the pair's transistors and provide an AFE with a wide dynamic range.

An input signal would typically be A.C.-coupled to the bases of the differential pair, and would see an input impedance primarily determined by the sum of the impedance networks connected to the respective bases. The impedance networks can be designed to provide a variety of functions. For example, simple resistors can be used to present a standard 50 Ω load to an RF input, while complex impedances can be used to tune out parasitics caused by package lead and wire bond inductances, or to filter the input.

The AFE presented can replace most differential input circuits requiring a low input impedance. For example, the AFE can serve as the input stage of a Gilbert mixer, presenting a 50 Ω load to a differential RF voltage input and converting it to a differential output current. By recapturing the headroom lost to the emitter circuit current source of the prior art, signals are permitted a larger swing for a given supply voltage. Alternatively, the low voltage AFE presented enables the use of lower voltage power supplies, thereby lowering weight and power dissipation requirements without sacrificing signal swing or dynamic range. The AFE can be configured to convert either a single-ended (ground referenced) or a differential input voltage.

Further features and advantages of the invention will be apparent to those skilled in the art from the following detailed description, taken together with the accompanying drawings.

DETAILED DESCRIPTION OF THE INVENTION

Figure 2:
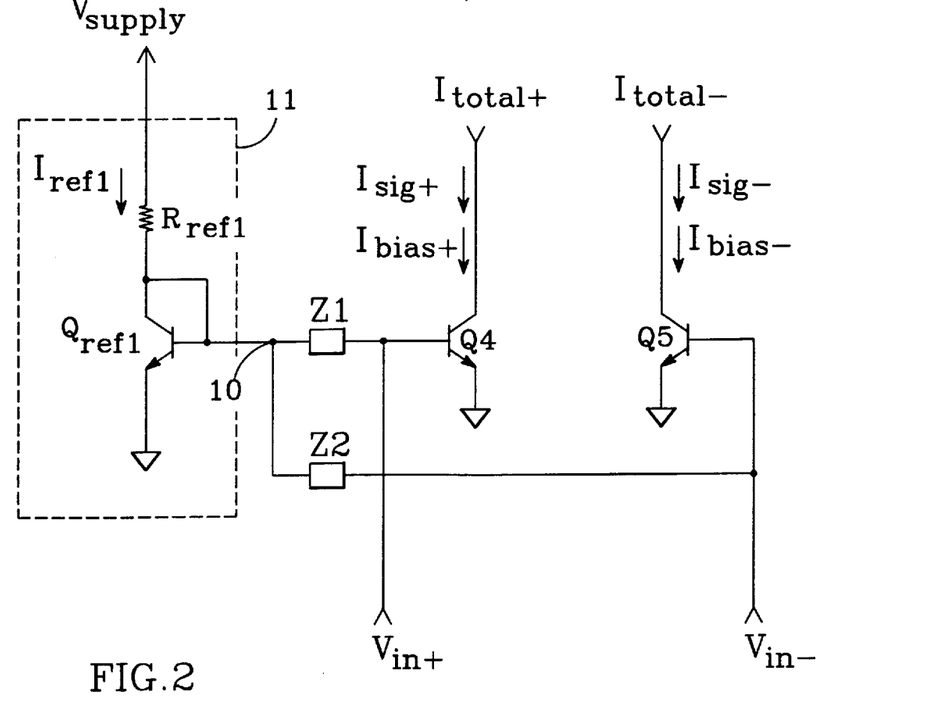
FIG. 2 is a schematic diagram of an AFE circuit per the present invention.

A low voltage AFE circuit per the present invention is shown in FIG. 2. A differential pair, preferably comprised of npn transistors Q4 and Q5, is connected to receive differential input voltage signals $V_{in+}$ and $V_{in-}$ at their respective bases and to produce differential current signals $I_{sig+}$ and $I_{sig-}$ at their respective collectors in response to $V_{in}$. The pair's emitters are connected to ground. Two impedances Z1 and Z2 are connected to the respective bases of Q4 and Q5 at one end, with their opposite ends connected together at a common node 10.

To properly perform the $V_{in}$ in to $I_{sig}$ conversion, Q4 and Q5 must be biased. This is accomplished with a current source 11 which is connected to the common node 10. A basic current source 11 comprising a diode-connected transistor $Q_{ref1}$ connected to a supply voltage $V_{supply}$ through a resistor $R_{ref1}$ is shown in FIG. 2, which generates a reference current $I_{ref1}$. Connecting the base of $Q_{ref1}$ to the common node 10 creates two current mirrors: one made up of $Q_{ref1}$ and Q4 and the other made up of $Q_{ref1}$ and Q5. Current source 11 forces voltages across the respective base-emitter circuits of Q4 and Q5, so that the reference current $I_{ref1}$ is mirrored through Q4 and Q5. These mirrored currents serve as DC bias currents $I_{bias+}$ and $I_{bias-}$ for Q4 and Q5, respectively. $I_{bias+}$ and $I_{bias-}$ will be equal if the emitter areas of Q4 and Q5 are equal, and their values are related to the emitter area of $Q_{ref1}$ as follows:

$$\frac{I_{bias+}}{I_{ref1}} = \frac{\text{emitter area of } Q4}{\text{emitter area of } Q_{ref1}} \quad (Eq. 1)$$

$$\frac{I_{bias-}}{I_{ref1}} = \frac{\text{emitter area of } Q5}{\text{emitter area of } Q_{ref1}} \quad (Eq. 2)$$

Differential current signals $I_{sig+}$ and $I_{sig-}$ produced in response to differential input voltage $V_{in}$ are superimposed on the DC bias currents to produce total differential output currents $I_{total+}$ and $I_{total-}$, which are given by:

$$I_{total+} = I_{bias+} + I_{sig+} \quad (Eq. 3)$$

$$I_{total-} = I_{bias-} + I_{sig-} \quad (Eq. 4)$$

Z1 and Z2 serve to present input signal $V_{in}$ with a particular input impedance, to prevent a dead short between the pair's bases, and to provide some isolation between the current source 11 and pair transistors Q4 and Q5. The input impedance seen by signal $V_{in}$ is equal to the parallel combination of Z1+Z2 and $Z_{Q4}+Z_{Q5}$, with $Z_{Q4}$ and $Z_{Q5}$ being the impedances looking into the bases of Q4 and Q5, respectively. $Z_{Q4}$ and $Z_{Q5}$ are proportional to the product of the current gains (betas) of their respective transistors Q4 and Q5 and the transistors' respective emitter resistances; the betas and emitter resistances are preferably made large enough to render $Z_{Q4}$ and $Z_{Q5}$ negligible compared to Z1 and Z2, so that the input impedance seen by $V_{in}$ is approximately equal to Z1+Z2. When there are no emitter resistors, as in FIG. 2, the emitter resistances are equal to each transistor's intrinsic resistance $r_e$; when there are emitter resistors, the emitter resistances are equal to the sum of the respective resistor and $r_e$ values.

Depending on their design, Z1 and Z2 can perform several functions. For example, an RF input signal typically requires an input impedance of 50 Ω. This is preferably achieved by implementing Z1 and Z2 with resistors that are about 25 Ω each. Z1 and Z2 are preferably about equal in value so that the input impedance presented to the input signal is balanced. Q4 and Q5 are preferably well-matched to reduce distortion caused by unequal base-emitter voltages.

Z1 and Z2 can also be realized as complex impedance networks which include resistors, capacitors and inductors. As complex impedances, Z1 and Z2 can act as matching networks to tune out parasitics such as the input capacitances of Q4 and Q5 or the package lead and bond wire inductances. Z1 and Z2 can also be designed to filter the input signal. Impedance networks designed to perform these types of functions are well-known, and are discussed in Bowick, *RF Circuit Design*, Howard W. Sams & Co. (1982), pp. 31, 44 and 66, for example.

The design of current source 11 is not limited to any particular design; it is only necessary that the current source used is capable of producing mirrored DC bias currents $I_{bias+}$ and $I_{bias-}$ sufficient to enable AFE performance that meets a system's requirements. To recover the headroom lost to a conventional emitter circuit current source, however, it is essential that no current source components be located in the current circuits of Q4 and Q5 which cause a voltage drop in the $V_{in}$ to $I_{total}$ signal path. Thus, a current source which generates $I_{bias+}$ and $I_{bias-}$ via current mirroring as described herein is preferred.

Figure 3A:
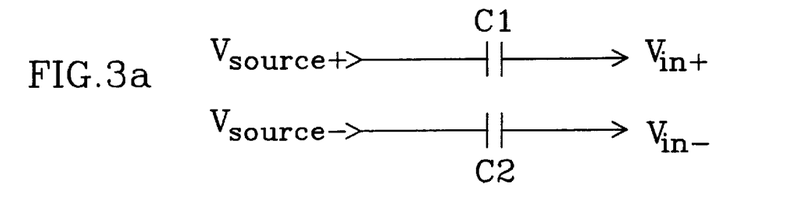
FIGS. 3a and 3b are schematic diagrams showing A.C.-coupling circuits which can be used with the present invention.
Figure 3B:
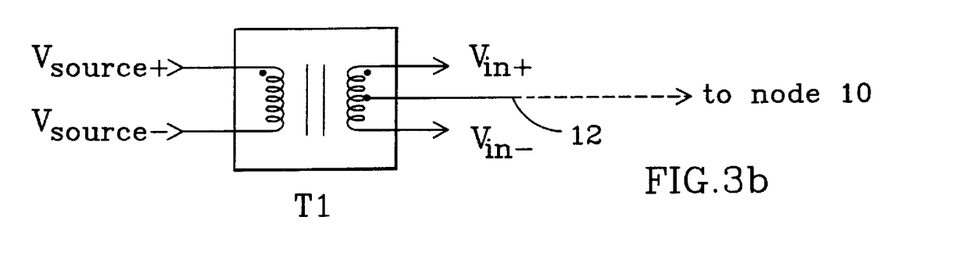

Differential input voltage signals $V_{in+}$ and $V_{in-}$ may be directly connected across the bases of Q4 and Q5 only if the DC operating voltage of the circuit producing the input signals is the same as the voltages at the bases of Q4 and Q5. When this is not the case, the input signal must be A.C.-coupled to Q4 and Q5, which allows a desired signal to pass from one circuit to another despite the fact that the circuits are at different operating voltages. There are many ways in which this can be accomplished, two of which are shown in FIGS. 3a and 3b. In FIG. 3a, differential input voltage signals $V_{source+}$ and $V_{source-}$ are connected to capacitors C1 and C2, respectively, with $V_{in+}$ and $V_{in-}$ produced on the capacitors' opposite terminals; the capacitors thus A.C.-couple $V_{source+}$ and $V_{source-}$ to the bases of Q4 and Q5, respectively.

In FIG. 3b, a transformer T1 provides the A.C.-coupling, with input signals $V_{source+}$ and $V_{source-}$ connected across T1's primary winding and its secondary winding producing the $V_{in+}$ and $V_{in-}$ differential input voltage signals that are connected across the bases of Q4 and Q5. $V_{in+}$ and $V_{in-}$ experience a small voltage drop caused by the base currents of Q4 and Q5, respectively, which can be avoided by connecting a center tap 12 of transformer T1 to common node 10. Both the capacitors C1, C2 of FIG. 3a and the transformer T1 of FIG. 3b provide common-mode rejection, which in the prior art was provided by the current source connected to the pair's coupled-emitter junction, as shown in FIG. 1.

Figure 4A:
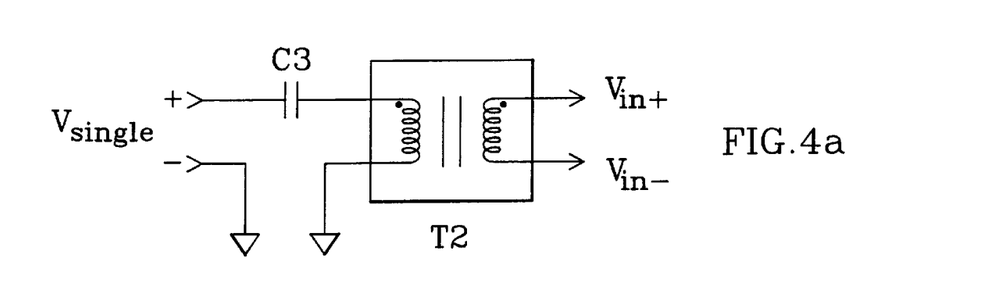
FIGS. 4a, 4b and 4c are schematic diagrams showing single-ended input circuits which can be used with the present invention.
Figure 4B:
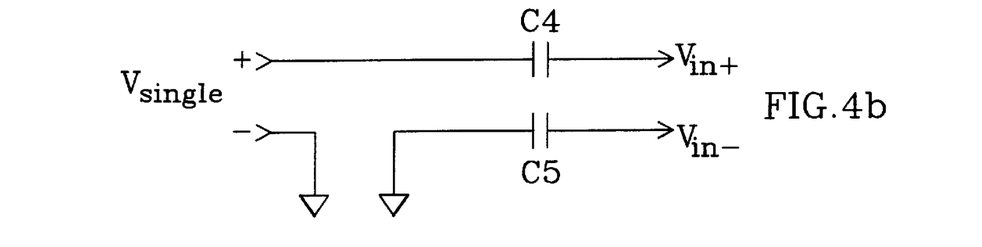
Figure 4C:
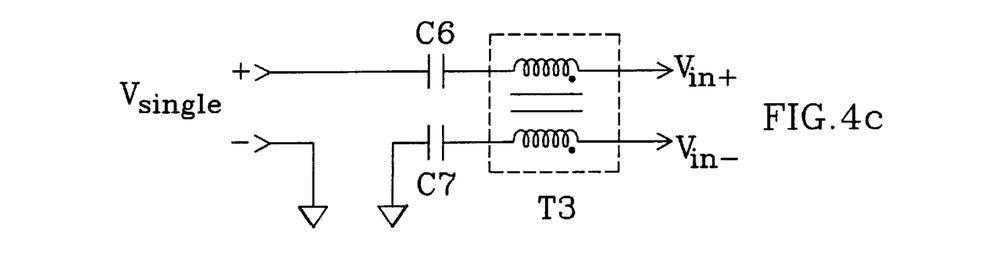

The AFE shown in FIG. 2 can also be used as a single-ended voltage to differential current converter, with three possible input schemes shown in FIGS. 4a, 4b and 4c. In FIG. 4a, a single-ended (ground-referenced) voltage $V_{single}$ is A.C.-coupled via capacitor C3 to one end of the primary winding of a transformer T2, with the other end of the primary winding grounded. T2's secondary winding produces the $V_{in+}$ and $V_{in-}$ signals connected to the bases of Q4 and Q5, respectively. In FIG. 4b, the single-ended input $V_{single}$ is connected to a capacitor C4, with C4's opposite terminal producing signal $V_{in+}$. Signal $V_{in-}$ is grounded via a capacitor C5. In FIG. 4c, a transformer T3 is rotated 90°; single-ended input $V_{single}$ is A.C.-coupled via capacitor C6 to one end of the T3's primary winding with the winding's other end producing $V_{in+}$. T3's secondary winding is grounded at one end via capacitor C7, and its other end produces $V_{in-}$.

Figure 5:
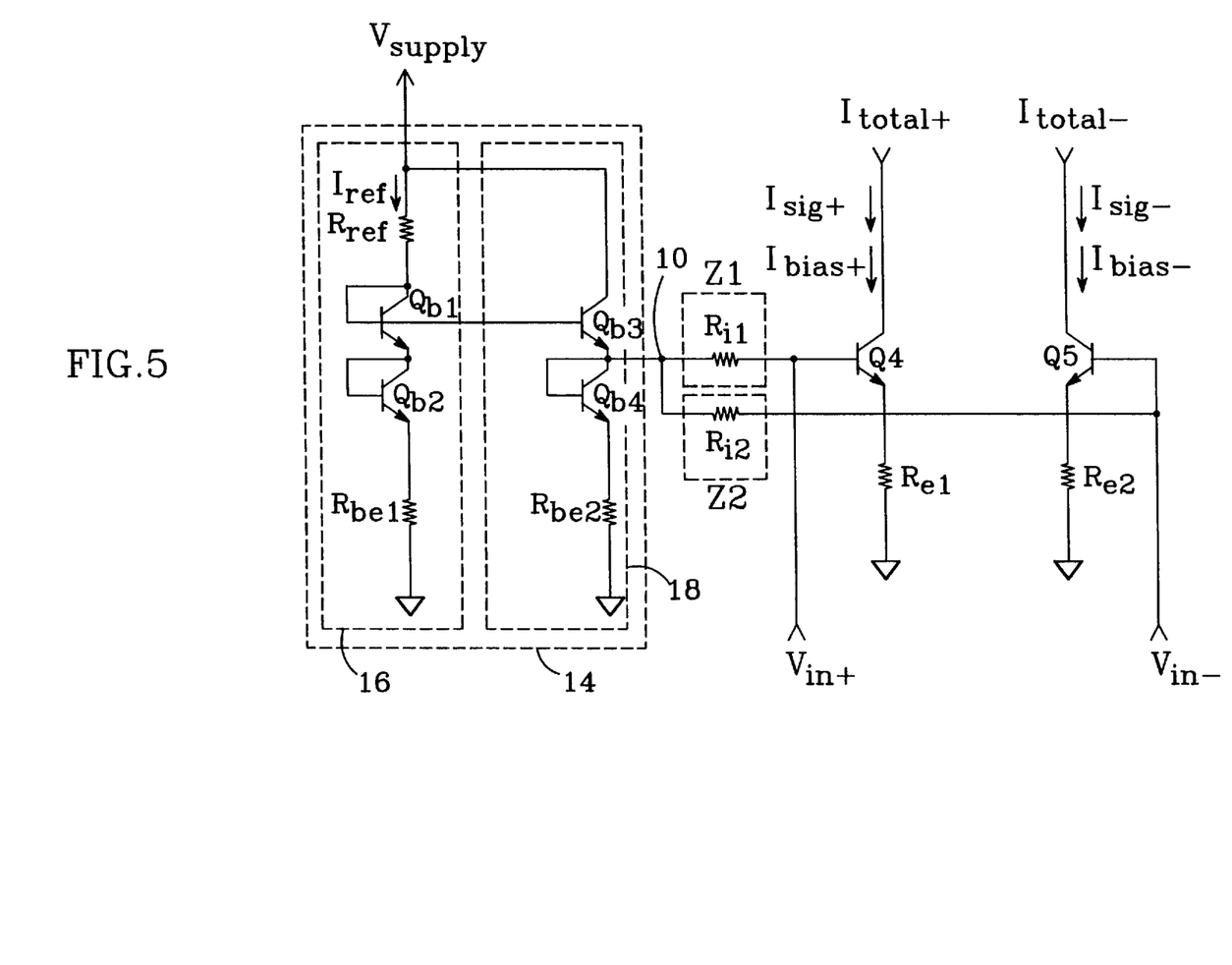
FIG. 5 is a schematic diagram of the preferred embodiment of the invention.

The preferred embodiment of the present invention is shown in FIG. 5. As with the circuit shown in FIG. 2, differential pair Q4/Q5 convert differential input voltage signals $V_{in+}$ and $V_{in-}$ to differential output current signals $I_{total+}$ and $I_{total-}$. Degeneration resistors $R_{e1}$ and $R_{e2}$ are preferably included in the emitter circuits of Q4 and Q5, respectively. Resistors $R_{e1}$ and $R_{e2}$ extend the range over which Q4 and Q5 operate linearly, increase the input impedances $Z_{Q4}$ and $Z_{Q5}$ looking into the bases of Q4 and Q5 (which helps render them negligible in comparison with impedance networks Z1 and Z2), and provide a simple means of setting the values of DC bias currents $I_{bias+}$ and $I_{bias-}$ (discussed below). Impedance networks Z1 and Z2 connected to the respective bases of Q4 and Q5 are preferably comprised of resistors $R_{i1}$ and $R_{i2}$, respectively. When $R_{i1}$ and $R_{i2}$ have small resistance values, for example 25 $\Omega$ each (appropriate to present a standard 50 $\Omega$ load to an RF input), the input impedance seen by $V_{in}$ is approximately equal to $R_{i1}+R_{i2}$.

Q4 and Q5 are biased by means of a current source 14 connected to the common node 10 at the junction of $R_{i1}$ and $R_{i2}$. The preferred current source 14 comprises a current reference circuit 16 and an output buffer circuit 18. The reference circuit preferably comprises a current reference resistor $R_{ref}$ connected between supply voltage $V_{supply}$ and the collector of a diode-connected npn transistor $Q_{b1}$, with $Q_{b1}$'s emitter connected to the collector of another diode-connected npn transistor $Q_{b2}$ whose emitter is connected to ground through an emitter degeneration resistor $R_{be1}$. The current through the reference circuit establishes a reference current $I_{ref}$ for the AFE which is given by:

$$I_{ref}=[V_{supply}-V_{be}(\text{of }Q_{b1})-V_{be}(\text{of }Q_{b2})]/(R_{ref}+R_{be1}) \quad (Eq.\ 5)$$

Output buffer circuit 18 is preferably comprised of a npn transistor $Q_{b3}$ having its collector connected to $V_{supply}$, its base connected to the base of $Q_{b1}$, and its emitter connected to the collector of a diode-connected transistor $Q_{b4}$ whose emitter is connected to ground through a degeneration resistor $R_{be2}$. $R_{be2}$ is typically made about equal to $R_{be1}$, so that the current through output buffer transistor $Q_{b4}$ mirrors the current through reference circuit transistor $Q_{b2}$ (i.e., $I_{ref}$). The respective currents can be made unequal by making $R_{be2}$ and $R_{be1}$ different values, as follows:

$$I(\text{through }Q_{b2})/I(\text{through }Q_{b4})=R_{be2}/R_{be1} \quad (Eq.\ 6)$$

Reference current $I_{ref}$ is also mirrored through transistors Q4 and Q5. The emitter of output buffer transistor $Q_{b3}$ is connected to common node 10, causing voltages to be forced across the respective base-emitter circuits of Q4 and Q5 so that reference current $I_{ref}$ is mirrored through Q4 and Q5. The mirrored currents serve to bias Q4 and Q5 and are designated as $I_{bias+}$ and $I_{bias-}$, respectively.

Output buffer circuit transistor $Q_{b3}$ functions as an emitter follower, which increases the drive capability of current source 14 and helps make possible the generation of DC bias currents $I_{bias+}$ and $I_{bias-}$ that are greater than $I_{ref}$. When this is the case, the current source is said to have a "mirrored current ratio" greater than one.

$I_{bias+}$ and $I_{bias-}$ are determined by the values of $R_{e1}$, $R_{e2}$, $R_{be1}$ and $R_{be2}$, and by the emitter current densities (current/area) of $Q_{b2}$, $Q_{b4}$, Q4 and Q5. By making the emitter current densities of these four transistors approximately equal and making $R_{be1}$ about equal to $R_{be2}$, the DC bias currents through Q4 and Q5 mirror the current through $Q_{b4}$, at ratios set by $R_{be2}/R_{e1}$ for $I_{bias+}$ and $R_{be2}/R_{e2}$ for $I_{bias-}$ as follows:

$$I_{bias+}=(R_{be2}/R_{e1})\times I_{ref}, \quad (Eq.\ 7)\ \text{and}$$

$$I_{bias-}=(R_{be2}/R_{e2})\times I_{ref} \quad (Eq.\ 8)$$

The DC bias currents through Q4 and Q5 can thus be easily set by selecting values for $R_{ref}$ and for degeneration resistors $R_{e1}$, $R_{e2}$ and $R_{be2}$ that provide the desired bias currents. As an example, assume $V_{supply}$=5 volts, $R_{ref}$=5 k$\Omega$, $V_{be}$ for both $Q_{b1}$ and $Q_{b2}$ is 0.7 volts, $R_{be1}$ and $R_{be2}$ are 500 $\Omega$, and $R_{e1}$ and $R_{e2}$ are 100 $\Omega$. From Eq. 5 above, $I_{ref}$=(5−0.7−0.7)/(5k+500)≈655 $\mu$A. Then, $I_{bias+}$=(500/100)×655≈3275 $\mu$A, and $I_{bias-}$=(500/100)×655≈3275 $\mu$A from Eqs. 7 and 8.

If $R_{be2}/R_{e1}$, $R_{be2}/R_{e2}$, or $R_{be2}/R_{be1}$ are not equal to 1, it is good design practice to ratio the emitter areas of the resistors' respective transistors as well. For example, the ratio of the emitter area of Q4 to the emitter area of $Q_{b4}$ should be made about equal to the ratio between $R_{be2}$ and $R_{e1}$.

An AFE parameter which is often critical to the system it is used in is dynamic range, which is the ratio of the largest to the smallest signal that a system can process. Dynamic range is reduced by a poor noise figure which limits the smallest signal, and by lost headroom which limits the largest signal. Producing an AFE with a wide dynamic range requires a considerable amount of DC bias current to flow through the AFE's transistors in order to linearize their response, which reduces distortion. Use of current source 14 is preferred because it can produce mirrored currents through Q4 and Q5 that are substantially larger than the source's reference current $I_{ref}$, i.e., it provides a mirrored current ratio greater than one. Many current source designs have a mirrored current ratio which is less than one, such as the basic Widlar current source shown in FIG. 2; these are disfavored due to the poor dynamic range AFE that results from their use.

If the parameters of Q4, Q5, $Q_{b2}$ and $Q_{b4}$ are well-matched, the degeneration resistors $R_{be1}$, $R_{be2}$, $R_{e1}$, and $R_{e2}$ can be eliminated, which results in an AFE that requires even less voltage headroom. For the $I_{bias}$ values calculated in the example above, removing $R_{e1}$ and $R_{e2}$ would add about 0.33 volts of headroom (3275 $\mu$A×100 $\Omega$). However, removing $R_{be1}$, $R_{be2}$, $R_{e1}$ and $R_{e2}$ eliminates the ability to set the DC bias currents via resistor ratios (though they may still be set via emitter area ratioing), and reduces the dynamic range of the AFE because of the loss of linearization which was provided by the degeneration resistors.

Transistors $Q_{b1}$, $Q_{b2}$ and $Q_{b4}$ are diode-connected and are used to perform a diode function. Other components that function as diodes can be substituted for these transistors, including conventional diodes. Diode-connected transistors are preferred in an I.C. implementation of the AFE, because transistors are typically readily available on an I.C. and their parameters are easily controlled.

Figure 6:
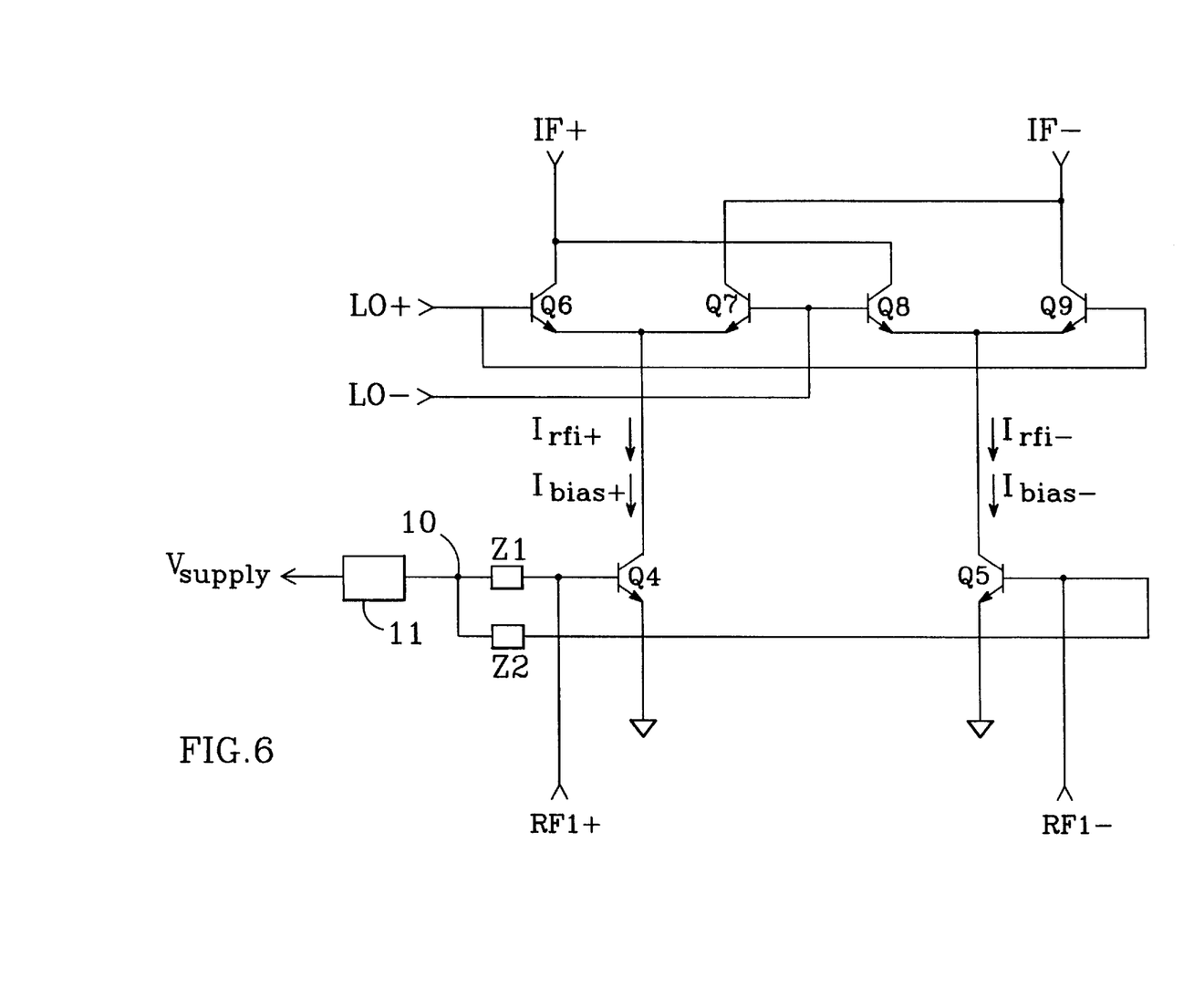
FIG. 6 is a schematic diagram of the invention as an element of a Gilbert mixer.

The AFE described herein can be used in many applications that require a voltage to differential current conversion, and is particularly useful if a low input impedance is needed. One such application uses the AFE as the input stage of a Gilbert mixer, as shown in FIG. 6. The AFE is configured and operated as discussed in conjunction with the circuit shown in FIG. 2, with differential pair Q4/Q5 converting differential input voltage signals RF1+ and RF1− to differential output current signals $I_{rf1+}$ and $I_{rf1-}$ which are superimposed on DC bias currents $I_{bias+}$ and $I_{bias-}$, respectively; the bias currents mirror a reference current generated by current source 11. As discussed above, an input voltage would typically be A.C.-coupled to the bases of Q4 and Q5 (A.C.-coupling not shown in FIG. 6).

The Gilbert mixer also includes an output stage consisting of two differential pairs, with the respective collectors of a differential pair Q6/Q7 connected to the respective collectors of a differential pair Q8/Q9. A differential local oscillator signal LO+ and LO− is applied to the two pairs, with LO+ connected to the bases of Q6 and Q9, and LO− connected to the bases of Q7 and Q8. Q6 and Q7 are joined at a common emitter junction which is connected to the collector of Q4 and conducts currents $I_{rf1+}$ and $I_{bias+}$; Q8 and Q9 have a common emitter junction which is connected to the collector of Q5 and conducts currents $I_{rf1}$ and $I_{bias-}$.

Local oscillator signal LO is preferably a 50% duty cycle square wave, and the transistors Q6–Q9 controlled by LO function as switches. Thus, the flow of $I_{rf1+}$ and $I_{bias+}$ alternates between switches Q6 and Q7 and the flow of $I_{rf1-}$ and $I_{bias-}$ alternates between switches Q8 and Q9, in accordance with the state of signal LO. The mixer produces differential output current signals IF+ and IF− at the collectors of Q6 (and Q8) and Q9 (and Q7), respectively. Gilbert mixers of this type are discussed, for example, in Gray and Meyer, *Analysis and Design of Analog Integrated Circuits*, supra, pp. 590–605.

By using the present invention as an input stage, the Gilbert mixer in FIG. 6 has more headroom for a given supply voltage than does a conventional Gilbert mixer circuit biased with a current source connected to the coupled-emitter circuits of its input stage transistors. More headroom enables larger signal voltage swings and a wider dynamic range, or alternatively allows the use of a lower supply voltage, reducing power and heat dissipation and possibly reducing power supply weight.

Though FIGS. 2, 5 and 6 show the use of npn transistors exclusively, the invention is not limited to these devices. Npn transistors are preferred due the well-developed techniques available to control device parameters such as emitter area, and their speed of operation. Other device families, including pnp transistors and FETs, could also be used for Q4 and Q5, current sources 11 and 14, and Gilbert mixer output stage transistors Q6–Q9.

While particular embodiments of the invention have been shown and described, numerous variations and alternate embodiments will occur to those skilled in the art. Accordingly, it is intended that the invention be limited only in terms of the appended claims.

We claim:

1. A low voltage analog front end (AFE) suitable for converting an input voltage to a differential output current, comprising:

first and second transistors having respective control inputs and respective current circuits controlled by said control inputs, said current circuits having respective output terminals and respective second terminals, said second terminals coupled to a ground point through respective first and second degeneration resistors, said second terminals otherwise electrically isolated from each other, first and second impedance networks each having first and second terminals, said first terminals connected to respective ones of said transistor control inputs and said second terminals connected together at a common junction, and a current source connected to said common junction and arranged to cause respective DC bias currents to be mirrored through respective ones of said transistor current circuits, said first and second transistors arranged to conduct a differential output current which comprises a differential signal current that varies with an input voltage applied across said control inputs and is superimposed on said DC bias currents, said first and second transistors conducting said differential output current from their respective output terminals to said ground point via their respective second terminals, said arrangement of said transistors and said mirrored bias currents enabling said first and second impedance networks to primarily establish the input impedance across said control inputs and allowing said differential signal current to be conducted from said second terminals to said ground point without significantly affecting said input impedance.

2. The AFE of claim 1, wherein said impedances comprise resistors which present a low impedance to an input voltage applied across said control inputs.

3. The AFE of claim 1, further comprising first and second capacitors, each of said capacitors connected at one terminal to a respective control input and A.C.-coupling a differential input voltage applied across said capacitors' opposite terminals to said control inputs.

4. The AFE of claim 1, further comprising a transformer having primary and secondary windings, said secondary winding connected across said control inputs, said transformer A.C.-coupling a differential input voltage applied across said primary winding to said control inputs.

5. The AFE of claim 1, wherein one of said control inputs is A.C.-coupled to ground such that said AFE converts a single-ended input voltage which is A.C.-coupled to the other of said control inputs to a differential output current.

6. The AFE of claim 1, wherein said current source conducts a reference current and is arranged to cause mirrored currents to flow through the current circuits of said first and second transistors that are substantially larger than said reference current.

7. The AFE of claim 1, wherein said current source comprises:

a current reference circuit connected to a supply voltage line and arranged to conduct a reference current, and an output buffer circuit connected to said reference circuit and arranged to force voltages across respective ones of said transistor control input-current circuit circuits to cause said transistors to conduct respective DC bias currents that are equal to said reference current multiplied by respective fixed ratios, said ratios each greater than one.

8. The AFE of claim 7, wherein said current reference circuit comprises a reference resistor, first and second diodes and a first degeneration resistor connected in series and arranged to conduct said reference current between said supply voltage line and ground, said output buffer circuit comprises a third transistor, a third diode and a second degeneration resistor connected in series and arranged to conduct current between said supply voltage line and ground, the control input of said third transistor connected to the junction between said reference resistor and said first diode such that the ratio of current through said second degeneration resistor to current through said first degeneration resistor is about equal to the ratio of the first degeneration resistor value to the second degeneration resistor value.

9. The AFE of claim 8, further comprising third and fourth degeneration resistors connected in series between the respective current circuits of said first and second transistors and ground, such that the DC bias current mirrored through each of said current circuits is about equal to the product of said reference current and the ratio of said second degeneration resistor value to said third and fourth degeneration resistor values, respectively.

10. The AFE of claim 1, wherein the impedances of said first and second impedance networks dominate the input impedances of said first and second transistors such that the input impedance seen by an input voltage applied across said control inputs is approximately equal to the sum of the impedances of said impedance networks.

11. The AFE of claim 1, wherein said first and second transistors are well-matched npn transistors.

12. The AFE of claim 1, further comprising an output stage having two current outputs, said output stage connected to receive said differential output current and which alternately switches said differential output current between said output stage current outputs in response to a control voltage, said input and output stages forming a Gilbert mixer.

13. A low voltage analog front end (AFE) suitable for converting an input voltage to a differential output current, comprising:
  first and second transistors having respective control inputs and respective current circuits controlled by said control inputs, said current circuits having respective output terminals and respective second terminals, said second terminals coupled to a ground point through respective first and second degeneration resistors, said second terminals otherwise electrically isolated from each other,
  first and second impedance networks each having first and second terminals, said first terminals connected to respective control inputs and said second terminals connected together at a common junction, and
  a current source, comprising:
    a current reference circuit connected between a supply voltage line and ground and arranged to conduct a reference current, and
    an output buffer circuit connected to said reference circuit and which includes a third degeneration resistor, said current reference circuit and output buffer circuit arranged to force voltages across the respective control input-current circuit circuits of said first and second transistors to cause said transistors to conduct respective DC bias currents which are about equal to the product of said reference current and the ratio of said third degeneration resistor value to said first and second degeneration resistor values, respectively,
  said first and second transistors arranged to conduct a differential output current which comprises a differential signal current that varies with an input voltage applied across said control inputs and is superimposed on said DC bias currents, said first and second transistors conducting said differential output current from their respective output terminals to said ground point via their respective second terminals, said arrangement of said transistors and said mirrored bias currents enabling said first and second impedance networks to primarily establish the input impedance across said control inputs and allowing said differential signal current to be conducted from said second terminals to said ground point without significantly affecting said input impedance.

14. The AFE of claim 13, wherein said first and second transistors are npn transistors.

15. The AFE of claim 13, wherein said first and second impedances are resistors which present a low impedance to an input voltage applied across said control inputs.

16. The AFE of claim 13, further comprising a transformer having primary and secondary windings, said secondary winding connected across said control inputs, said transformer A.C.-coupling a differential input voltage applied across said primary winding to said control inputs.

17. The AFE of claim 13, wherein said current reference circuit comprises a reference resistor, first and second diodes and a fourth degeneration resistor connected in series and arranged to conduct said reference current between said supply voltage line and ground, said output buffer circuit further comprises a third transistor and a third diode connected in series with said third degeneration resistor and arranged to conduct current between said supply voltage line and ground, the control input of said third transistor connected to the junction between said reference resistor and said first diode such that the ratio of current through said third degeneration resistor to current through said fourth degeneration resistor is about equal to the ratio of the fourth degeneration resistor value to the third degeneration resistor value.

18. A Gilbert mixer circuit, comprising:
  an input stage, comprising:
    first and second transistors having respective control inputs and respective current circuits controlled by said control inputs, said current circuits having respective output terminals and respective second terminals, said second terminals coupled to a ground point through respective first and second degeneration resistors, said second terminals otherwise electrically isolated from each other,
    first and second impedance networks each having first and second terminals, said first terminals connected to respective ones of said transistor control inputs and said second terminals connected together at a common junction, and
    a current source connected to said common junction and arranged to cause respective DC bias currents to be mirrored through respective ones of said transistor current circuits,
    said first and second transistors arranged to conduct a differential output current which comprises a differential signal current that varies with an input voltage applied across said control inputs and is superimposed on said DC bias currents, said first and second transistors conducting said differential output current from their respective output terminals to said ground point via their respective second terminals, said arrangement of said transistors and said mirrored bias currents enabling said first and second impedance networks to primarily establish the input impedance across said control inputs and allowing said differential signal current to be conducted from said second terminals to said ground point without significantly affecting said input impedance; and
  an output stage having two current outputs, said output stage connected to receive said differential output current and which alternately switches said differential output current between said output stage current outputs in response to an alternating control voltage.

19. The Gilbert mixer of claim 18, wherein said output stage comprises:
  a first differential transistor pair having respective control inputs and respective current circuits, said first pair's current circuits connected together at a common junction which is connected to receive said differential output current from said input stage, said first pair's transistors being alternately switched on in response to said alternating control voltage applied to said first pair's control inputs, and a second differential transistor pair having respective control inputs and respective current circuits which are connected to respective current circuits of said first pair, said connections between said respective current circuits forming said output stage's current outputs, said second pair's current circuits connected together at a common junction which is connected to receive said differential output current from said input stage, said second pair's transistors being alternately switched on in response to said alternating control voltage applied to said second pair's control inputs.

* * * * *